(12) United States Patent
Jang et al.

(10) Patent No.: US 8,852,988 B2
(45) Date of Patent: Oct. 7, 2014

(54) SEMICONDUCTOR PACKAGE AND METHOD OF MANUFACTURING THE SAME

(71) Applicant: Samsung Electronics Co., Ltd, Suwon-si (KR)

(72) Inventors: Hyung-Sun Jang, Anyang-si (KR); Woon-Seong Kwon, Anyang-si (KR); Tae-Je Cho, Yongin-si (KR); Un-Byoung Kang, Hwaseong-si (KR); Jung-Hwan Kim, Bucheon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/909,160

(22) Filed: Jun. 4, 2013

(65) Prior Publication Data
US 2013/0267057 A1    Oct. 10, 2013

Related U.S. Application Data

(62) Division of application No. 12/915,157, filed on Oct. 29, 2010, now Pat. No. 8,466,527.

(30) Foreign Application Priority Data

Jan. 22, 2010  (KR) .......................... 10-2010-0006034

(51) Int. Cl.
*H01L 31/18*  (2006.01)
*H01L 27/146* (2006.01)

(52) U.S. Cl.
CPC .......... *H01L 31/18* (2013.01); *H01L 27/14687* (2013.01); *H01L 27/14632* (2013.01); *H01L 27/14618* (2013.01)
USPC ............................................. 438/68; 438/75

(58) Field of Classification Search
USPC ...................................................... 438/68, 75
See application file for complete search history.

(56) References Cited

U.S. PATENT DOCUMENTS

2008/0296715 A1 * 12/2008 Kumata et al. ................ 257/432
2010/0117181 A1 *  5/2010 Kim et al. ..................... 257/432

FOREIGN PATENT DOCUMENTS

| CN | 101355069 | 1/2009 |
| JP | 2003-175500 | 6/2003 |
| JP | 2008-153720 | 7/2008 |
| KR | 20090038490 | 4/2009 |

OTHER PUBLICATIONS

Chinese Office Action dated Jul. 3, 2014 issued in CN Application No. 201010622415.4.

* cited by examiner

*Primary Examiner* — Long Pham
(74) *Attorney, Agent, or Firm* — Stanzione & Kim, LLP

(57) ABSTRACT

A semiconductor package and a method for manufacturing the same are provided. The semiconductor package includes a semiconductor chip having a first surface, a second surface and a pixel area, first adhesion patterns disposed on the first surface, second adhesion patterns disposed between the first adhesion patterns and the pixel area and disposed on the first surface, and external connection terminals disposed on the second surface, wherein the second adhesion patterns and the external connection terminals are disposed to overlap each other.

12 Claims, 14 Drawing Sheets

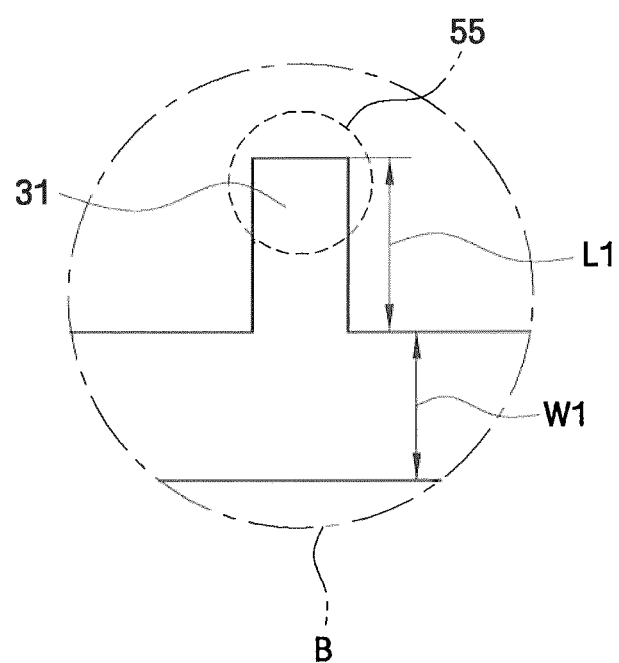

SEMICONDUCTOR PACKAGE AND METHOD OF MANUFACTURING THE SAME

CROSS-REFERENCE TO RELATED APPLICATIONS

This is a Divisional application of prior U.S. application Ser. No. 12/915,157, filed on Oct. 29, 2010 in the U.S. Patent and Trademark Office, which claims the benefit of priority from Korean Patent Application No. 10-2010-0006034 filed on Jan. 22, 2010 in the Korean Intellectual Property Office, and all the benefits accruing therefrom under 35 U.S.C. 119, the contents of which are incorporated by reference herein in their entirety.

BACKGROUND

1. Field of the Invention

The present general inventive concept relates to a semiconductor package and a method of manufacturing the same.

2. Description of the Related Art

An image sensor, such as a charge coupled device (CCD) image sensor or a complementary metal oxide semiconductor (CMOS) is widely used in a variety of electronic products, including mobile phones, digital cameras, optical mobile mice, biometric identification systems, and so on. Due to the trend towards miniaturized and multi-functional electronic products, there is an ever increasing demand for semiconductor packages incorporating image sensors, which require slimness, high density, low power consumption, multi-functionality, ultrahigh-speed signal processing, high reliability, cost effectiveness, high resolution, and so on. In order to meet these requirements, various research works for methods of mounting two or more semiconductor chips in one package are being carried out.

SUMMARY

The present general inventive concept provides a semiconductor package, in which cracks are minimally generated and a crack generation area can be reduced.

The present general inventive concept also provides a method for manufacturing a semiconductor package, in which cracks are minimally generated and a crack generation area can be reduced.

These and other objects of the present general inventive concept will be described in or be apparent from the following description of the preferred embodiments.

Additional aspects and utilities of the present general inventive concept will be set forth in part in the description which follows and, in part, will be obvious from the description, or may be learned by practice of the present general inventive concept.

Features and/or utilities of the present general inventive concept may be realized by a semiconductor package including a semiconductor chip having a first surface, a second surface and a pixel area, first adhesion patterns disposed on the first surface, second adhesion patterns disposed between the first adhesion patterns and the pixel area and disposed on the first surface, and external connection terminals disposed on the second surface, wherein the second adhesion patterns and the external connection terminals are disposed to overlap each other.

Features and/or utilities of the present general inventive concept may also be realized by a method of manufacturing a semiconductor package including preparing a semiconductor chip having a first surface, a second surface and a pixel area, forming first adhesion patterns on the first surface, forming second adhesion patterns on the first surface to be disposed between the first adhesion patterns and the pixel area, and forming external connection terminals on the second surface, wherein the second adhesion patterns and the external connection terminal overlap each other.

Features and/or utilities of the present general inventive concept may also be realized by a semiconductor package including a semiconductor chip having a pixel area and an edge area surrounding the pixel area, a first adhesion pattern located on a first surface of the semiconductor chip closer to an edge of the semiconductor chip than the pixel area, a second adhesion pattern located on the first surface of the semiconductor chip between the pixel area and the first adhesion pattern, and external connection terminals mounted to the second surface of the semiconductor chip, wherein the second adhesion pattern overlaps each of the external connection terminals in a direction perpendicular to the first surface of the semiconductor chip.

The second adhesion pattern may include a plurality of protrusions extending toward the pixel area from the first adhesion pattern.

Each of the plurality of protrusions may include an extension portion adjacent to the first adhesion pattern and a tip portion, and the extension portion may have a width in a first direction and the tip portion may have a length in the first direction that is longer than the width of the extension portion.

The tip portion may overlap a corresponding external connection terminal.

The second adhesion pattern may include a plurality of islands separated from the first adhesion pattern.

The semiconductor package may further include microlenses located in the pixel area on the first surface of the semiconductor chip, and the semiconductor chip may include photoelectric converters to receive light via the microlenses to convert the receive light to electrical signals and wiring to transmit the electrical signals.

The semiconductor package may further include interlayer dielectric films located between the microlenses and the photoelectric converters, the wiring may be located in the interlayer dielectric films, and the wiring may be positioned at locations corresponding to ends of the respective microlenses in the direction perpendicular to the first surface of the semiconductor chip to allow light to pass via the interlayer dielectric films.

The interlayer dielectric films may be located on an opposite side of the photoelectric converters with respect to the microlenses, and the wiring may be positioned at locations to overlap the photoelectric converters in the direction perpendicular to the first surface of the semiconductor chip.

Features and/or utilities of the present general inventive concept may also be realized by a method of forming a semiconductor package including forming a first adhesion pattern on a first surface of a semiconductor wafer to surround a pixel area, forming a second adhesion pattern between the first adhesion layer and the pixel area, and attaching a transparent substrate to the first and second adhesion patterns.

The second adhesion pattern may include a plurality of protrusions that extends from the first adhesion pattern toward the pixel area.

The method may further include forming external connection terminals on a second surface of the semiconductor wafer opposite the first surface, and the plurality of protrusions may overlap the respective external connection terminals in a direction perpendicular to the first surface of the semiconductor wafer.

The method may further include forming vias in the semiconductor wafer to connect conductive pads located on the first surface with redistribution pads located on a second surface opposite the first surface, forming insulation layers on the second surface to cover portions of the redistribution pads, and cutting the semiconductor wafer to form separate semiconductor chips.

BRIEF DESCRIPTION OF THE DRAWINGS

The above and other features and advantages of the present general inventive concept will become more apparent by describing in detail preferred embodiments thereof with reference to the attached drawings in which:

FIG. 6B is an enlarged view of a portion 'B' of FIG. 6A;

DETAILED DESCRIPTION OF THE EMBODIMENTS

Figure 1:
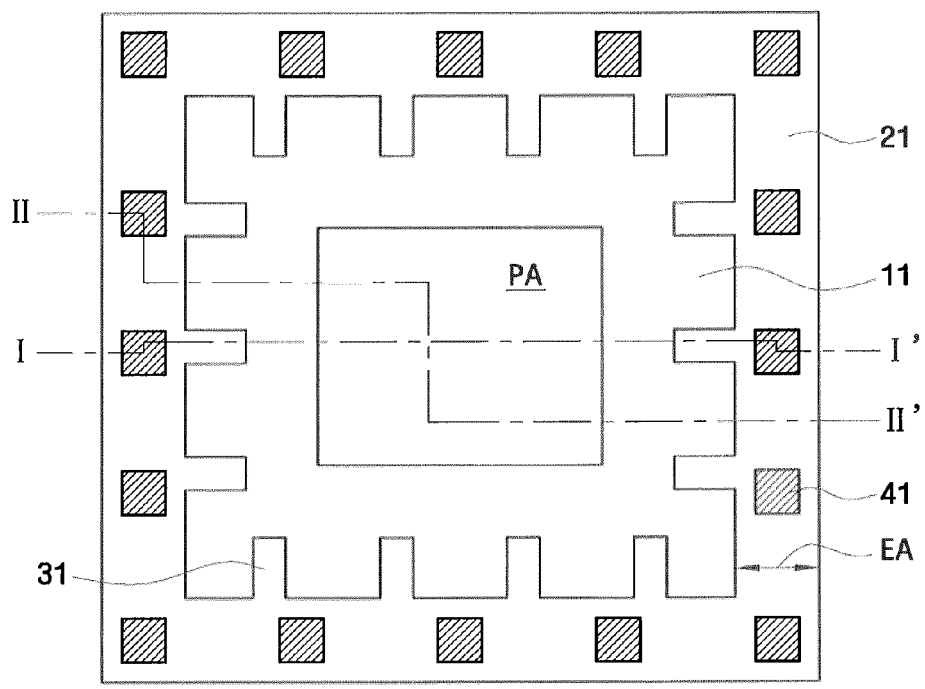
FIG. 1 is a plan view of a semiconductor package according to a first embodiment of the present general inventive concept.

Advantages and features of the present general inventive concept and methods of accomplishing the same may be understood more readily by reference to the following detailed description of preferred embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims. Like numbers refer to like elements throughout.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element or layer is referred to as being "connected to" or "coupled to" another element or layer, it can be directly on, connected or coupled to the other element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present general inventive concept.

The terminology used herein is for the purpose of describing particular embodiments only and is not intended to be limiting of the general inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "vertical", "horizontal", "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Embodiments described herein will be described referring to plan views and/or cross-sectional views by way of ideal schematic views of the general inventive concept. Accordingly, the exemplary views may be modified depending on manufacturing technologies and/or tolerances. Therefore, the embodiments of the general inventive concept are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the general inventive concept.

Hereinafter, semiconductor package according to embodiments and method for manufacturing the same will be described with reference to the accompanying drawings.

First, a semiconductor package according to a first embodiment of the present general inventive concept will be described with reference to FIGS. 1 through 7B.

Figure 2:
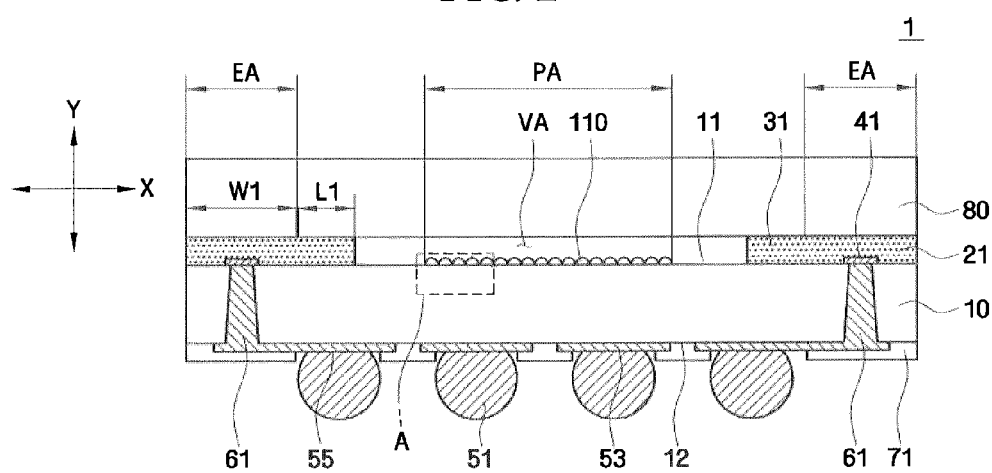
FIG. 2 is a cross-sectional view of the semiconductor package of FIG. 1 along line I-I'.
Figure 3:
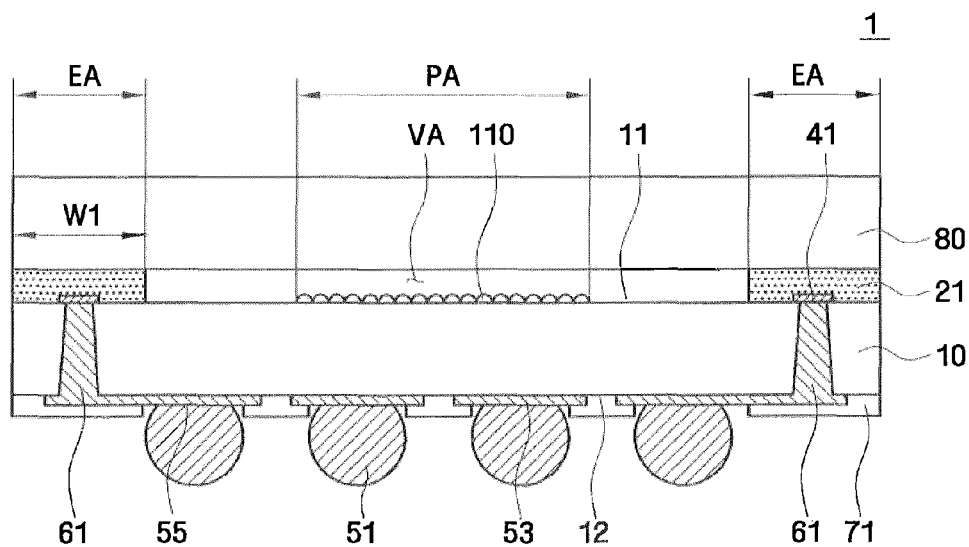
FIG. 3 is a cross-sectional view of the semiconductor package of FIG. 1 along line II-II'.
Figure 4:
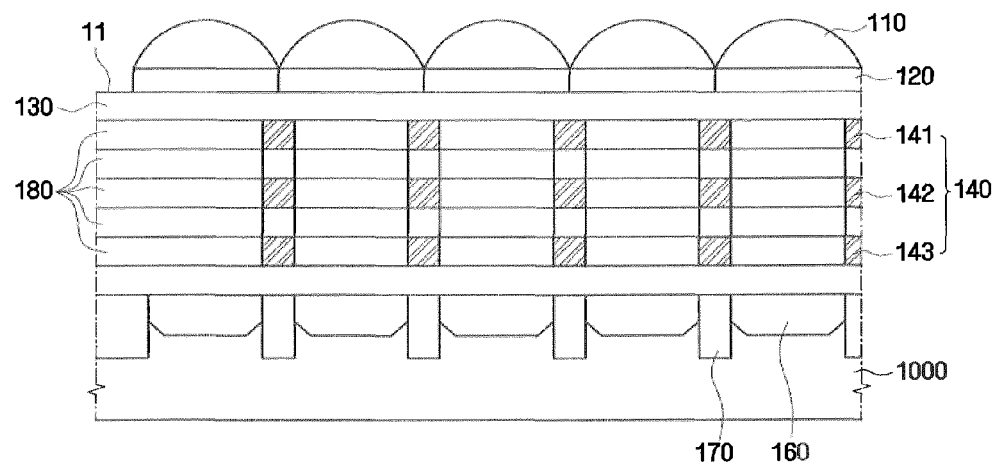
FIG. 4 is a first enlarged view of a portion 'A' of FIG. 1.
Figure 5:
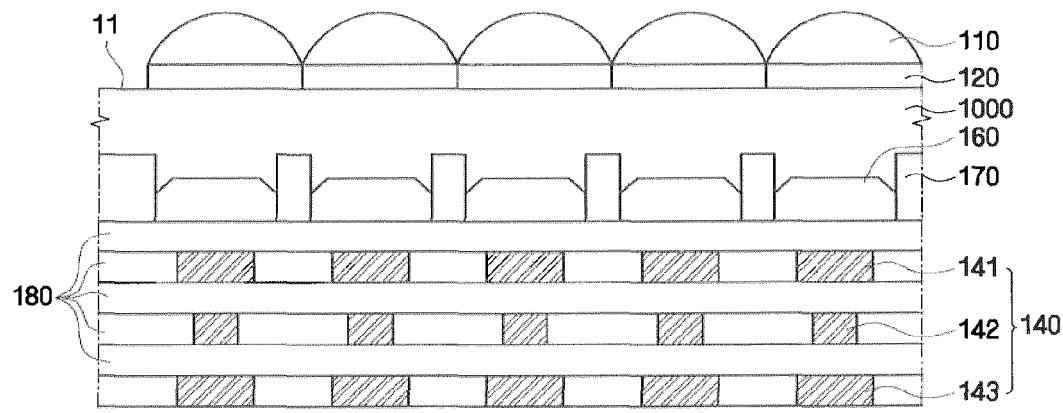
FIG. 5 is a second enlarged view of a portion 'A' of FIG. 1.
Figure 6A:
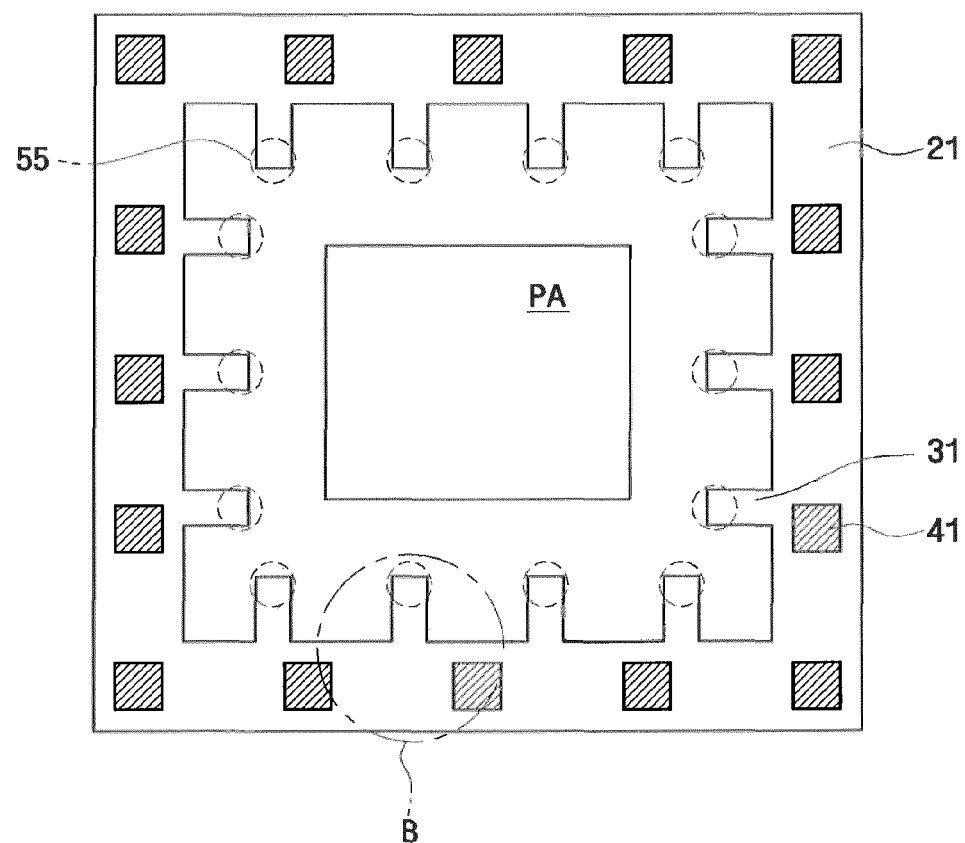
FIG. 6A illustrates a relationship between a junction region and a second adhesion pattern.
Figure 7A:
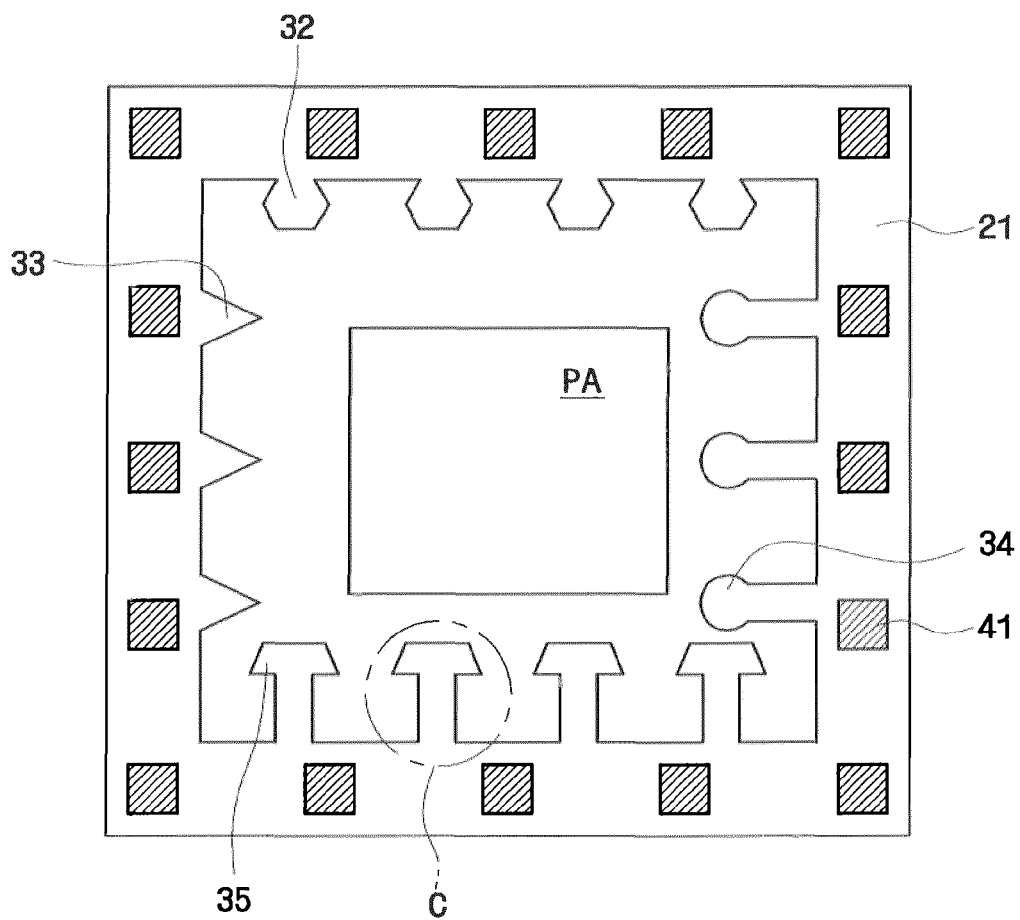
FIG. 7A illustrates various examples of the second adhesion pattern according to a first embodiment of the present general inventive concept.
Figure 7B:
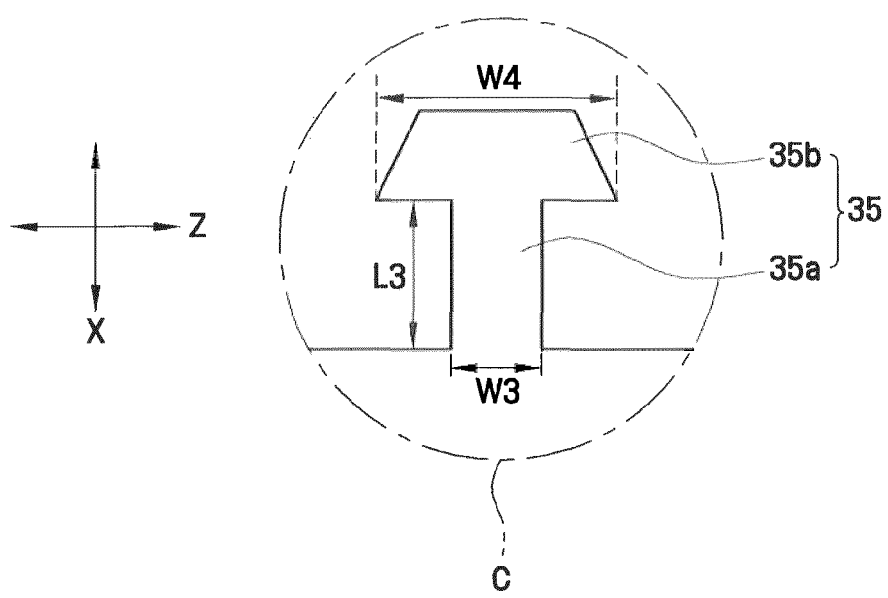
FIG. 7B is an enlarged view of a portion 'C' of FIG. 7A.

FIG. 1 is a plan view of a semiconductor package according to a first embodiment of the present general inventive concept, FIG. 2 is a cross-sectional view of the semiconductor package of FIG. 1 along line I-I', FIG. 3 is a cross-sectional view of the semiconductor package of FIG. 1 along line II-II', FIG. 4 is a first enlarged view of a portion 'A' of FIG. 1, FIG. 5 is a second enlarged view of a portion 'A' of FIG. 1, FIG. 6A illustrates a relationship between a junction region and a second adhesion pattern, FIG. 6B is an enlarged view of a portion 'B' of FIG. 6A, FIG. 7A illustrates various examples of the second adhesion pattern according to a first embodiment of the present general inventive concept, and FIG. 7B is an enlarged view of a portion 'C' of FIG. 7A.

Referring to FIGS. 1 through 3, the semiconductor package 1 according to an embodiment of the present general inventive concept includes a semiconductor chip 10, first adhesion patterns 21, second adhesion patterns 31, external connection terminals 51, and a transparent substrate 80.

The semiconductor chip 10 includes a first surface 11, a second surface 12, and a pixel area PA. In addition, the semiconductor chip 10 includes an edge area EA surrounding the pixel area PA. Here, the pixel area PA may be disposed at the center of the semiconductor chip 10, but the present general inventive concept are not limited thereto. Meanwhile, although the pixel area PA has a rectangular shape in the illustrated embodiment, it may have a square shape or any other desired shape. The pixel area PA may include an array of microlenses 110. Here, the array of microlenses 110 in the pixel area PA may be disposed on the first surface 11 of the semiconductor chip 10. The pixel area PA will later be described in more detail.

The first adhesion patterns 21 are disposed on the first surface 11 of the semiconductor chip 10. Here, the first adhesion patterns 21 may be disposed on the first surface 11 to surround the pixel area PA. To this end, the first adhesion patterns 21 may be disposed on the edge area EA of the semiconductor chip 10. That is to say, the first adhesion patterns 21 are disposed along the edge area EA to have a closed loop surrounding the pixel area PA. As illustrated in FIG. 1, the first adhesion patterns 21 may be connected to form a single pattern. Alternatively, the first adhesion patterns 21 may have different widths, lengths, shapes, or other characteristics. For example, the first adhesion patterns 21 located on opposite sides of the semiconductor package 1 may have a same pattern, shape, or width, and the first adhesion patterns 21 that are located adjacent to each other, or that are connected at corners of the semiconductor package, may have different widths, lengths, shapes, or other characteristics.

The first adhesion patterns 21 fix the transparent substrate 80 on the first surface 11 of the semiconductor chip 10. To this end, as illustrated in FIGS. 2 and 3, the first adhesion patterns 21 may be interposed between the semiconductor chip 10 and the transparent substrate 80. Here, a void area VA may be formed between the transparent substrate 80 and the pixel area PA due to a thickness of the first adhesion patterns 21. Meanwhile, in a case where the first adhesion patterns 21 is shaped of a closed loop, the void area VA may be shielded from the outside. Accordingly, the pixel area PA disposed inside the void area VA may be protected from ambient air. A decrease in the light receiving level or degradation in the life spans of elements in the pixel area PA, which may be generated in a case where the microlenses 110 in the pixel area PA, for example, are influenced by the ambient air, can be prevented. Meanwhile, a width W1 of the first adhesion patterns 21 is large enough to securely fix the transparent substrate 80 on the first surface 11 of the semiconductor chip 10. To this end, the width W1 of the first adhesion patterns 21 may be in a range, for example, between approximately 60 µm and 150 µm.

In exemplary embodiments, the first adhesion patterns 21 may include photosensitive adhesive polymers, thermosetting polymers, and/or epoxy-based mixtures. An example of the first adhesion patterns 21 may include benzocyclobutene.

The second adhesion patterns 31 are disposed between the first adhesion patterns 21 and the pixel area PA. In addition, the second adhesion patterns 31 may be disposed on the first surface 11 of the semiconductor chip 10. The second adhesion patterns 31 according to an embodiment of the present general inventive concept protrude from one side of the first adhesion patterns 21 to face the pixel area PA. Here, the second adhesion patterns 31 may protrude a predetermined length L1 from the one side of the first adhesion patterns 21 toward the pixel area PA. For example, the predetermined length L1 of the second adhesion patterns 31 may be in a range between approximately 75 µm and approximately 120 µm. Like the first adhesion patterns 21, the second adhesion patterns 31 may fix the transparent substrate 80 on the first surface 11 of the semiconductor chip 10.

As illustrated in FIG. 1, the second adhesion patterns 31 may protrude from the first adhesion patterns 21 in a direction toward a center or middle part of the semiconductor package 1. The second adhesion patterns 31 may be a plurality of protrusions that are spaced apart from each other and connected to the first adhesion patterns 21. Alternatively, the second adhesion patterns 31 may be physically separated from the first adhesion patterns 21.

The second adhesion patterns 31 may be formed of the same material as the first adhesion patterns 21. In exemplary embodiments, the second adhesion patterns 31 may include photosensitive adhesive polymers, thermosetting polymers, and/or epoxy-based mixtures. An example of the second adhesion patterns 31 may include benzocyclobutene.

Meanwhile, like the first adhesion patterns 21, the second adhesion patterns 31 may also be interposed between the semiconductor chip 10 and the transparent substrate 80. In addition, the second adhesion patterns 31 and the first adhesion patterns 21 allow the transparent substrate 80 to be more securely fixed on the first surface 11 of the semiconductor chip 10. Further, the second adhesion patterns 31 may relieve physical stress applied to the semiconductor chip 10, which will later be described in more detail.

Referring to FIGS. 1 through 4, the semiconductor chip 10 according to the first embodiment of the present general inventive concept may be a front side illumination image sensor chip. In detail, the semiconductor chip 10 may include conductive pads 41 in the edge area EA of the first surface 11 where the microlenses 110 are disposed. In the semiconductor chip 10, isolation layers 170 are arranged in a semiconductor substrate 1000 to define active regions. A plurality of photoelectric converters 160 may be disposed within the semiconductor substrate 1000 corresponding to the pixel area PA. Meanwhile, although not shown, a plurality of transistors (not shown) for transmitting and processing signals from the plurality of photoelectric converters 160 may be disposed on the semiconductor substrate 1000. The plurality of transistors may form, for example, peripheral circuits, transistors, in an area excluding the pixel area PA, that is, in the edge area EA and between the pixel area PA and the edge area EA.

The transistors and the photoelectric converters 160 may be covered by multi-layered interlayer dielectric films 180 and etch stop layers (not shown) which are stacked alternately one on top of the other. In addition, wiring 140 may connect the multi-layered interlayer dielectric films 180 with the etch stop layers. The wiring 140 may include wirings 141, 142, and 143 corresponding to respective layers of the semiconductor chip 10.

Meanwhile, although not shown in the drawing, some of the interlayer dielectric films 180 and the etch stop layers, which overlap with the photoelectric converters 160 may be removed from the pixel area PA. Resin patterns (not shown) having excellent light transmittance at an area from which some of the interlayer dielectric films 180 and the etch stop layers are removed. Accordingly, when light is incident into the photoelectric converters 160 through the array of microlenses 110, it is possible to prevent the light incident into the semiconductor chip 10 from being reflected/diffracted/interfered by the interlayer dielectric films 180 and the etch stop layers. That is to say, a loss of the light incident into the semiconductor chip 10 is reduced, thereby improving light sensitivity and realizing a sharp picture quality.

The wirings 141, 142 and 143 disposed in the pixel area PA may be disposed at locations overlapping the isolation layers 170. Accordingly, it is possible to prevent the light incident into the photoelectric converters 160 from being blocked or reflected by the wirings 141, 142 and 143.

The conductive pads 41 may be disposed on a top surface of the topmost interlayer dielectric film 180 in the edge area EA. The conductive pads 41 may be integrally formed with via plugs (not shown) connected to wirings (not shown) disposed in the edge area EA.

Meanwhile, the planarization layer 130 may be disposed on the top surface of the interlayer dielectric film 180. In addition, color filters 120 may be disposed on the planarization layer 130 in the pixel area PA so as to overlap the photoelectric converters 160 corresponding to various pixels. The color filters 120 may be a red-green-blue (RGB) type color filters that separate natural light into three primary colors of light or complementary color filters that separate natural light into four (CYGM) colors of cyan, yellow, green, and magenta. The microlenses 110 may be disposed on the color filters 120.

Meanwhile, the semiconductor chip 10 may include through vias 61 connected to the conductive pads 41. The through vias 61 may be formed for the purpose of reducing the overall size of the semiconductor package while increasing a signal transmission speed.

The semiconductor package 1 may include redistribution pads 53 disposed on the second surface 12 of the semiconductor chip 10. Here, the redistribution pads 53 adjacent to the edge area of the semiconductor chip 10 may electrically contact the through vias 61. That is to say, one side of each of the through vias 61 may electrically contact the conductive pads 41 and the other side thereof may electrically contact the redistribution pads 53.

The semiconductor package 1 may include external connection terminals 51 disposed on the second surface 12 of the semiconductor chip 10. The external connection terminals 51 may be shaped of, for example, solder balls, but aspects of the present general inventive concept are not limited thereto. The external connection terminals 51 may have various shapes according to shapes of connection terminals of a mother board on which the semiconductor package 1 is to be mounted. The external connection terminals 51 may be disposed on the redistribution pads 53. Here, the external connection terminals 51 may include junction regions 55 electrically contacting the redistribution pads 53. Accordingly, the external connection terminals 51 may transmit signals applied from the redistribution pads 53 to the outside of the semiconductor package 1. The junction regions 55 face the second surface 13 of the semiconductor chip 10.

An insulation layer 71 may be disposed on at least part of the redistribution pads 53. That is to say, the insulation layer 71 may be positioned on the partial regions of the redistribution pads 53 where the redistribution pads 53 are not in contact with the external connection terminals 51, and the insulation layer 71 may not be on the portions of the redistribution pads 52 where the redistribution pads 53 contact the external connection terminals 51. The insulation layer 71 may prevent the redistribution pads 53 and the outside of the semiconductor chip 10 from being electrically short-circuited. Accordingly, unnecessary signal routing to the semiconductor chip 10 can be prevented.

Referring to FIG. 5, the semiconductor chip 10 according to an embodiment of the present general inventive concept may be a back side illumination image sensor chip. In this case, the light incident through the microlenses 110 and the color filters 120 may be directly incident into the photoelectric converters 160. Here, in order to reduce an optical path of the incident light, part of the semiconductor substrate 1000 may be eliminated. Since the back side illumination image sensor chip is configured such that light is directly incident into the photoelectric converters 160 through the semiconductor substrate 1000, it may not be restricted by locations of the wirings 141, 142 and 143. In other words, the wirings 141, 142, and 143 may be located directly beneath the respective microlenses 110, if desired.

Referring to FIGS. 1 through 3 and FIGS. 6A and 6B, the second adhesion patterns 31 and the external connection terminals 51 may be disposed to overlap each other. Here, the second adhesion patterns 31 may overlap the junction regions 55 of the external connection terminals 51. In other words, if a substantially flat planar first surface 11 or second surface 12 of the semiconductor chip 10 defines a first horizontal axis X, and a direction perpendicular to the horizontal axis X defines a vertical axis Y, then a line of infinite narrowness passing through the junction region 55 in the vertical direction Y may also pass through one of the second patterns 31. A substantial portion of the junction region 55, such as 15%-30% of a surface area of the junction region 55 may overlap a corresponding one of the second patterns 31 in the vertical direction Y.

As described in the specification and recited in the claims, the "center" of the junction region 55 may correspond to a center point if the junction region 55 is substantially circular in shape, or may correspond to a point equidistant from the vertices of a polygon when the junction region 55 is a polygon, or may correspond to a center of mass, or a point closest to the center of mass, of a non-polygon shape.

Since the second adhesion patterns 31 and the external connection terminals 51 are disposed to overlap each other, generation of cracks which may occur to the semiconductor chip 10 or an increase in the area where cracks are generated may be avoided. As described above, the void area VA may be formed by adhesion patterns, etc. interposed between the semiconductor chip 10 and the transparent substrate 80. In addition, the semiconductor package 1 may include the external connection terminals 51 so as to allow the semiconductor chip 10 to be mounted on a mother board. For example, if the external connection terminals 51 are shaped in forms of solder balls, an external force applied to the semiconductor package 1 may be concentrated on the solder balls. In particular, the external force may be concentrated on regions of the semiconductor chip 10 around the solder balls by the void area VA formed in the semiconductor package 1. Here, if a strength of the semiconductor chip 10 is not high enough to withstand the external force, cracks may be generated in the semiconductor chip 10 due to the concentrated external force. If no second adhesion patterns 31 are formed, cracks may be generated at the regions of the semiconductor chip 10 corresponding to surrounding portions of the first adhesion patterns 21. Specifically, the cracks may be considerably generated at the regions of the semiconductor chip 10 corresponding to the first adhesion patterns 21 facing the pixel area PA. Accordingly, the device reliability of may be considerably deteriorated.

Since the semiconductor package 1 according to an embodiment of the present general inventive concept includes the second adhesion patterns 31 protruding a predetermined length L1 from the one side of the first adhesion patterns 21 toward the pixel area PA, the strength of the semiconductor chip 10 can be reinforced, thereby minimizing cracks generated in the semiconductor chip 10. In addition, since the second adhesion patterns 31 and the external connection terminals 51 are disposed to overlap each other with respect to the vertical axis Y, the crack generation area in the semiconductor chip 10 due to the external force concentrating on the external connection terminals 51 can be reduced. That is to say, the cracks are caused to be generated at portions of the semiconductor chip 10 corresponding to ends of the second adhesion patterns 31 facing the pixel area PA by forming the second adhesion patterns 31 to face the pixel area PA. Since the cracks are generated at the regions corresponding to the surrounding portions of the second adhesion patterns 31, generation of the cracks is caused to occur at an inner side of the semiconductor chip 10, thereby reducing the overall crack generation area, compared to a case where cracks are generated at the portions corresponding to the surrounding portions of the second adhesion patterns 21.

To reduce the crack generation area using the second adhesion patterns 31, the second adhesion patterns 31 may be disposed to overlap the center of the junction regions 55 of the external connection terminals 51. Here, the ends of the second adhesion patterns 31 may be disposed to pass the center of the junction regions 55 of the external connection terminals 51. In other words, if a line of an infinite narrowness passes parallel to the vertical axis Y passes through the center of a junction region 55, the line would also pass through the end of one of the second adhesion patterns 31. For example, the line may pass through a point where the second adhesion pattern 31 ends, or through a point that is within 0%-10% of the end of the second adhesion pattern 31 in a length direction of the second adhesion pattern 31.

A ratio of a width W1 of the first adhesion pattern 21 to a protruding length L1 of the second adhesion pattern 31, that is, W1/L1, may range from 0.5 to 2. If the ratio of the width W1 of the first adhesion pattern 21 to the protruding length L1 of the second adhesion pattern 31 is less than 0.5, the effect of reducing the crack generation area based on the second adhesion patterns 31 may be negligible. Conversely, if the ratio of the width W1 of the first adhesion pattern 21 to the protruding length L1 of the second adhesion pattern 31 exceeds 2, the effect of reducing the crack generation area corresponding to the exceeding length may not be exerted.

Figure 7C:
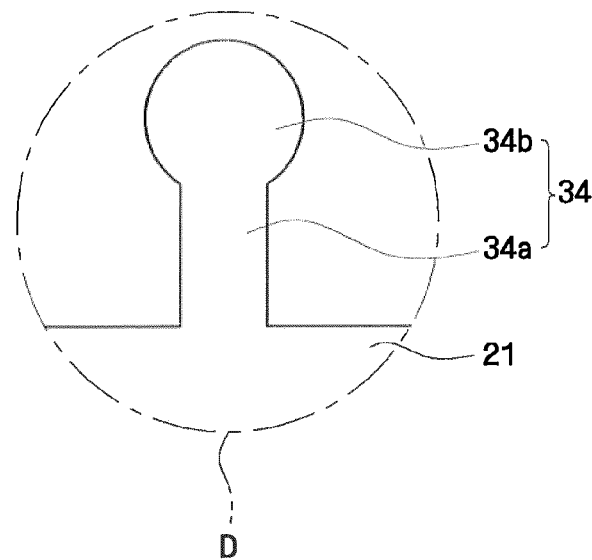
FIG. 7C is an enlarged view of a portion 'D' of FIG. 7A.

Referring to FIGS. 7A, 7B, and 7C, second adhesion patterns 32, 33, 34, and 35 may be formed to have various shapes. That is to say, the second adhesion patterns 32, 33, 34, and 35 may be formed to have polygonal or curved shapes. However, the second adhesion patterns 32, 33, 34, and 35 having various shapes illustrated in FIG. 7A are provided only for illustration, and they may have shapes different from those illustrated, if necessary. FIGS. 7B and 7C illustrate magnification views of portions C and D, respectively, of FIG. 7A.

Each of the second adhesion patterns 34 and 35 may include a first protruding part 34a or 35a protruding from the first adhesion pattern 21, and a second protruding part 34b or 35b extending from the first protruding part 34a or 35a. The first protruding part 34a or 35a and the second protruding part 34b or 35b may have different shapes. For example, the first protruding part 34a or 35a may be formed to have a stick shape, or a shape having a length L3 along the axis X longer than a width W3 along an axis Z. The second protruding part 34b or 35b may be formed to have a trapezoid shape, as illustrated in FIG. 7B. Alternatively, the second protruding part 34b may be formed of a pattern having a curved shape as illustrated in FIG. 7C. Further, the second adhesion patterns 34 and 35 may be formed such that a width W3 of the first protruding part 34a or 34b and a width W4 of the second protruding part 34b or 35b are different from each other. For example, the width of the second protruding part 34b or 35b may be greater than that of the first protruding part 34a or 35a. Therefore, the strength of the semiconductor chip 10 can be greatly reinforced at the second protruding part 34b and 35b relative to a semiconductor chip 10 having no second adhesion patterns or having no second protruding parts 34b or 35b. Accordingly, cracks can be generated at the regions of the semiconductor chip 10 corresponding to the surrounding portions of the ends of the second protruding part 34b or 35b. The shapes of the first protruding part 34a or 35a and the second protruding part 34b or 35b are not limited to those illustrated in FIGS. 7A and 7B, and they may be formed in various shapes different from those illustrated, if necessary.

Next, a semiconductor package according to another embodiment of the present general inventive concept will be described with reference to FIGS. 8 through 12.

Figure 8:
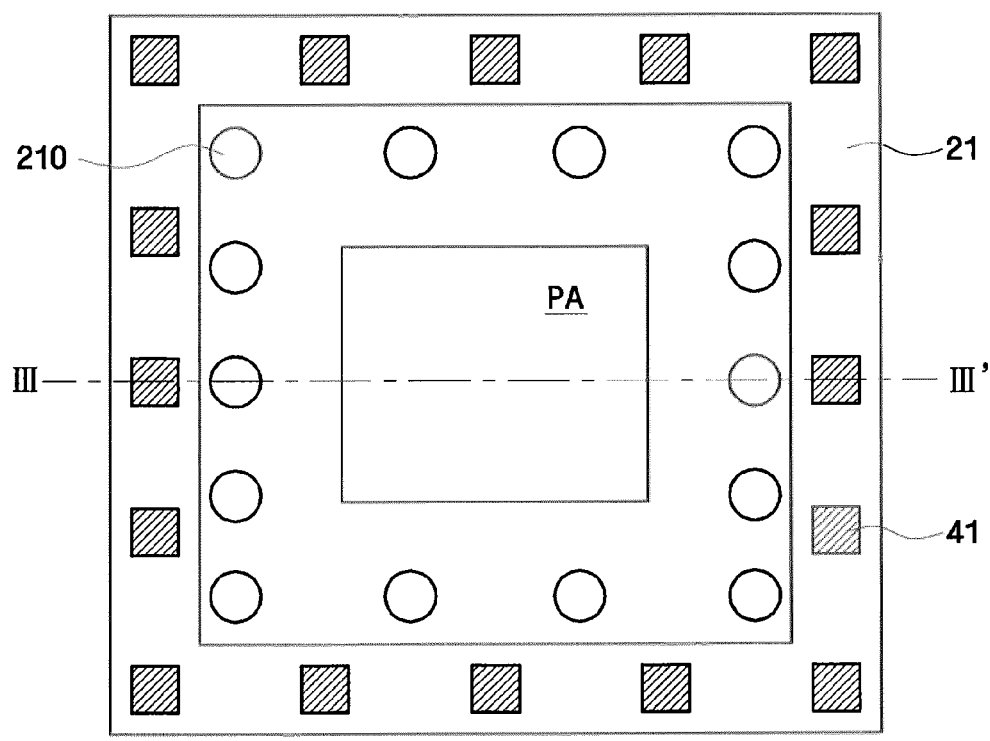
FIG. 8 is a plan view of a semiconductor package according to a second embodiment of the present general inventive concept.
Figure 9:
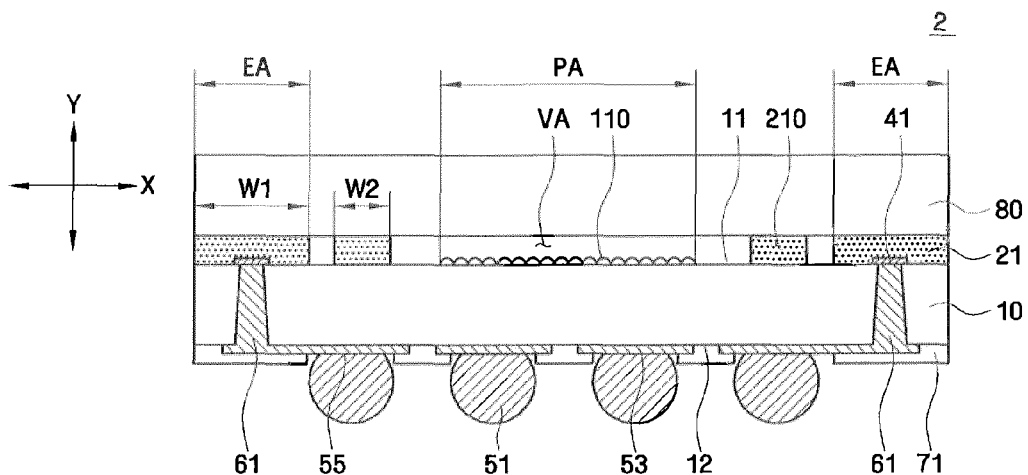
FIG. 9 is a cross-sectional view of the semiconductor package of FIG. 1 along line III'-III'.
Figure 10:
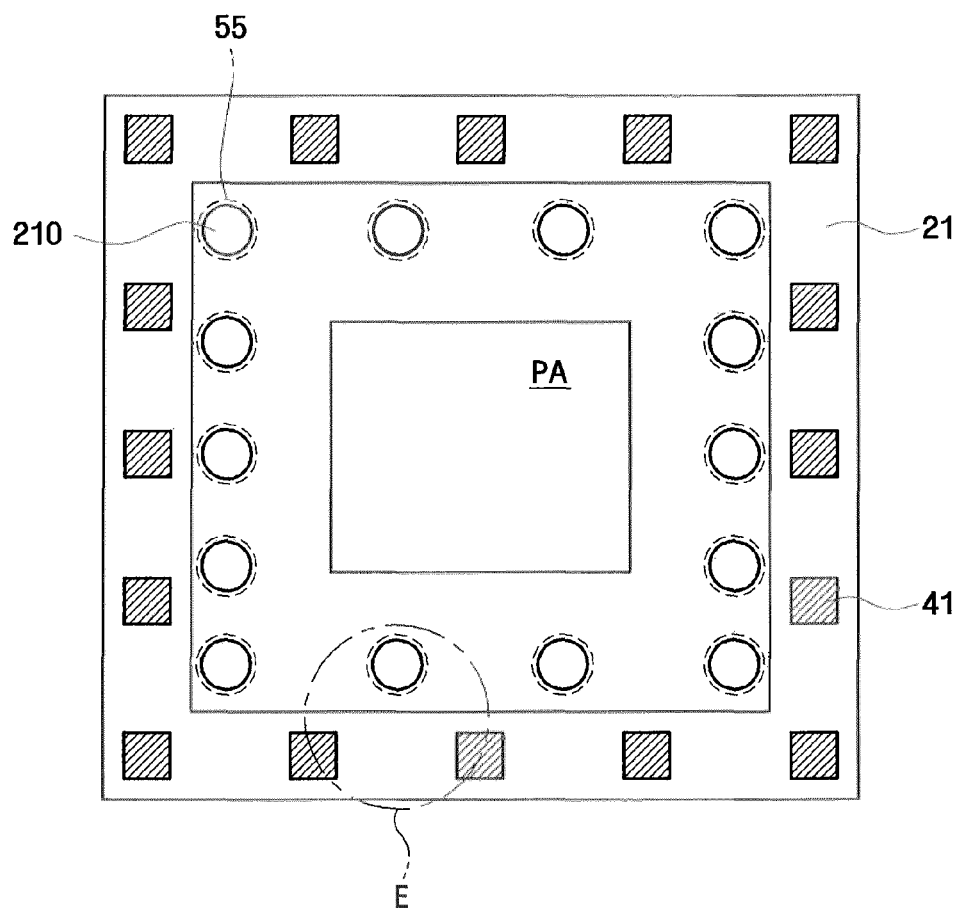
FIG. 10 illustrates a relationship between a second bonding package and an external connection package.
Figure 11:
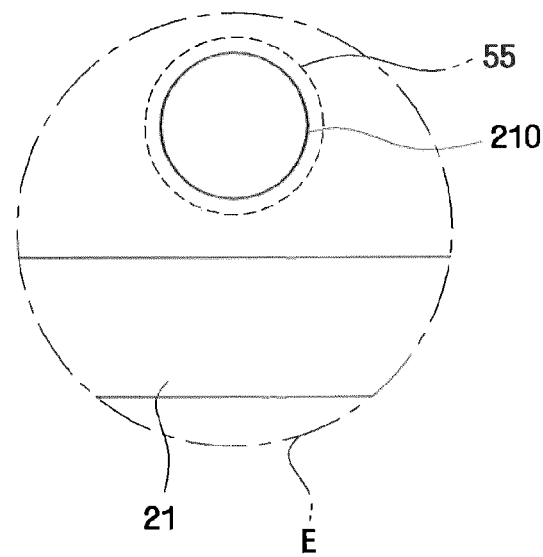
FIG. 11 is an enlarged view of a portion 'E' of FIG. 10.
Figure 12:
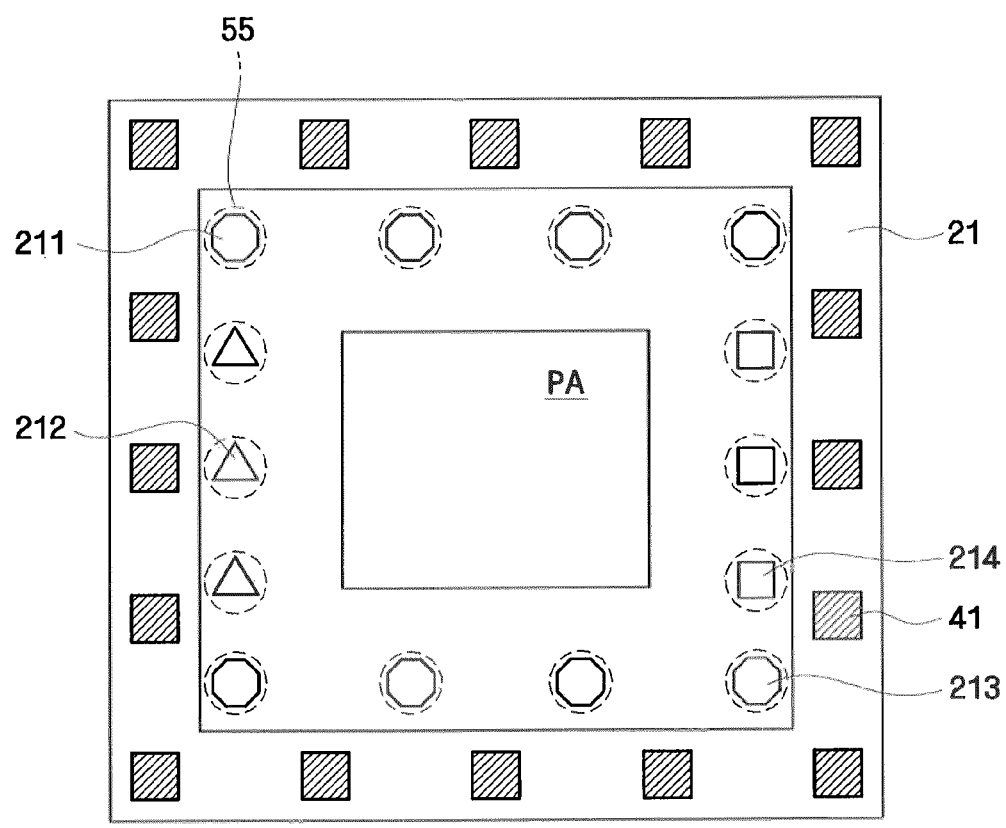
FIG. 12 illustrates various examples of the second adhesion pattern according to the embodiment of the present general inventive concept.

FIG. 8 is a plan view of a semiconductor package according to another embodiment of the present general inventive concept, FIG. 9 is a cross-sectional view of the semiconductor package of FIG. 1 along line III-III', FIG. 10 illustrates a relationship between a second bonding package and an external connection package, FIG. 11 is an enlarged view of a portion 'E' of FIG. 10, and FIG. 12 illustrates various examples of the second adhesion pattern according to the embodiment of the present general inventive concept. For brevity of explanation, elements which have the same functions as those of the first embodiment are denoted by the same reference numerals and symbols, and thus the repetition of the description thereof is omitted.

Referring to FIGS. 8 and 9, the semiconductor package 2 according to the second embodiment of the present general inventive concept has substantially the same configuration as the semiconductor package 1 according to the first embodiment. That is to say, as shown in FIGS. 8 and 9, second adhesion patterns 210 included in the second semiconductor package 2 according to the second embodiment may be formed to have patterns shaped of islands spaced a predetermined distance apart from first adhesion patterns 21. In other words, the second adhesion patterns 210 according to the second embodiment are formed to be spaced apart from the first adhesion patterns 21, rather than being formed to protrude from the first adhesion patterns 21, and to have shapes of islands. If a width W1 of the first adhesion pattern 21 in the horizontal direction X ranges from 60 to 150 μm, a width W2 of the second adhesion pattern 210 in the horizontal direction X may range from 75 to 120 μm. That is to say, a ratio of the width W1 of the first adhesion pattern 21 to the width W2 of the second adhesion pattern 210, i.e., W1/W2, may be in a range of 0.5 to 2.

As illustrated in FIGS. 10 and 11, the second adhesion patterns 210 overlap the external connection terminals 51 to be disposed on the first surface 11 of the semiconductor chip 10. FIG. 11 illustrates a magnification view of the portion E of FIG. 10. As described above, each of the external connection terminals 51 includes a junction region 55 facing the second surface 12 of the semiconductor chip 10. The second adhesion patterns 210 overlap the junction regions 55 of the external connection terminals 51. Each of the second adhesion pattern 210 may overlap at least one fourth (¼) the area of the junction region 55. If an overlapping area between the second adhesion pattern 210 and the junction region 55 is smaller than ¼ the area of the junction region 55, the strength of the semiconductor chip 10 reinforced against the external force applied to the external connection terminal 51 may not be sufficiently high, making it difficult to reduce the crack generation area due to the external force from the semiconductor chip 10. That is to say, the function of the second adhesion patterns 210 inducing cracks to be generated at the portions of the semiconductor chip 10 corresponding to the surrounding portions of the second adhesion patterns 210 may not be sufficiently exerted.

In other words, a surface area of the second adhesion pattern 210 contacting the first surface 11 of the semiconductor chip 10 overlaps at least ¼ of the surface area of the junction region 55 of the external connection terminals and the redistribution pads 53. As describe in the present specification and claims, the second adhesion pattern 210 overlaps a portion of the junction region 55 when a line having an infinite narrowness and extending in the vertical direction Y passes through each of the second adhesion pattern 210 and the junction region 55.

Meanwhile, the second adhesion patterns 210 may overlap the external connection terminals 51 at and through the center of the junction regions 55. Accordingly, the strength of the semiconductor chip 10 can be reinforced and the external force concentrating on the external connection terminals 51 can be dispersed to the surrounding portions of the second adhesion patterns 210. Therefore, cracks are caused to be generated at the portions of the semiconductor chip 10 corresponding to the surrounding portions of the second adhesion patterns 31, thereby reducing the crack generation area from the semiconductor chip 10.

Referring to FIG. 12, the second adhesion patterns 210 according to the second embodiment may have various shapes of patterns 211, 212, 213, and 214. That is to say, the second adhesion patterns 211, 212, 213, and 214 may be formed to have polygonal or curved shapes. However, the second adhesion patterns 32, 33, 34, and 35 having various shapes illustrated in FIG. 12 are provided only for illustration, and they may have shapes different from those illustrated, if necessary.

Next, a method for manufacturing a semiconductor package according to another embodiment of the present general inventive concept will be described with reference to FIGS. 13 through 16.

FIGS. 13 through 16 are cross-sectional views illustrating a method for manufacturing a semiconductor package 1 according to another embodiment of the present general inventive concept. For brevity of explanation, elements which have the same functions as those of the first embodiment are denoted by the same reference numerals and symbols, and thus the repetition of the description thereof is omitted.

Figure 13:
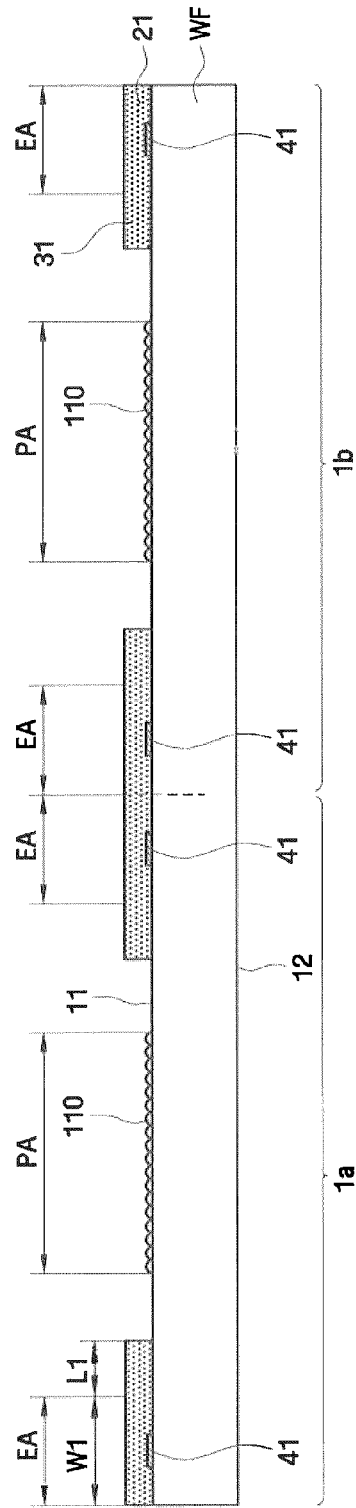
FIGS. 13 through 16 are cross-sectional views illustrating a method for manufacturing a semiconductor package according to a third embodiment of the present general inventive concept.

Referring to FIG. 13, a wafer WF to be divided into unit semiconductor chips 10 is prepared, each of the portions 1a and 1b of the wafer corresponding to the separated unit semiconductor chips 10 includes the first and second adhesion patterns 21 and 31, microlenses 110, and conductive pads 41, as shown in FIG. 2.

First adhesion patterns 21 and second adhesion patterns 31 are formed on the wafer WF. The first adhesion patterns 21 are formed on edge areas EA of a first surface 11 of the semiconductor chip portions 1a and 1b. Here, the first adhesion patterns 21 may be formed to surround pixel areas PA of the semiconductor chip portions 1a and 1b. The second adhesion patterns 31 are formed to protrude from either side of the first adhesion patterns 21 to face the pixel areas PA.

The first adhesion patterns 21 may be formed to have a width W1 in the range of 60 to 150 μm. Here, a protruding length L1 of each of the second adhesion patterns 31 may range from 75 to 120 μm. That is to say, a ratio of the width W1 of the first adhesion pattern 21 to the protruding length L1 of each of the second adhesion patterns 31, that is, W1/L1, may range from 0.5 to 2.

The first adhesion patterns 21 and the second adhesion patterns 31 may be simultaneously formed of the same material. According to one embodiment, in order to form the first adhesion patterns 21 and the second adhesion patterns 31, an adhesive photoresist polymer layer is coated on the entire surface of the wafer WF and a soft baking process is performed at low temperature of approximately 50 to approximately 70° C. In addition, exposure and development processes are performed to form the first adhesion patterns 21 and the second adhesion patterns 31. In addition to the above-described processes, the first adhesion patterns 21 and the second adhesion patterns 31 may be formed using a screen printing process, an ink-jet process, or a dispenser process.

Figure 14:
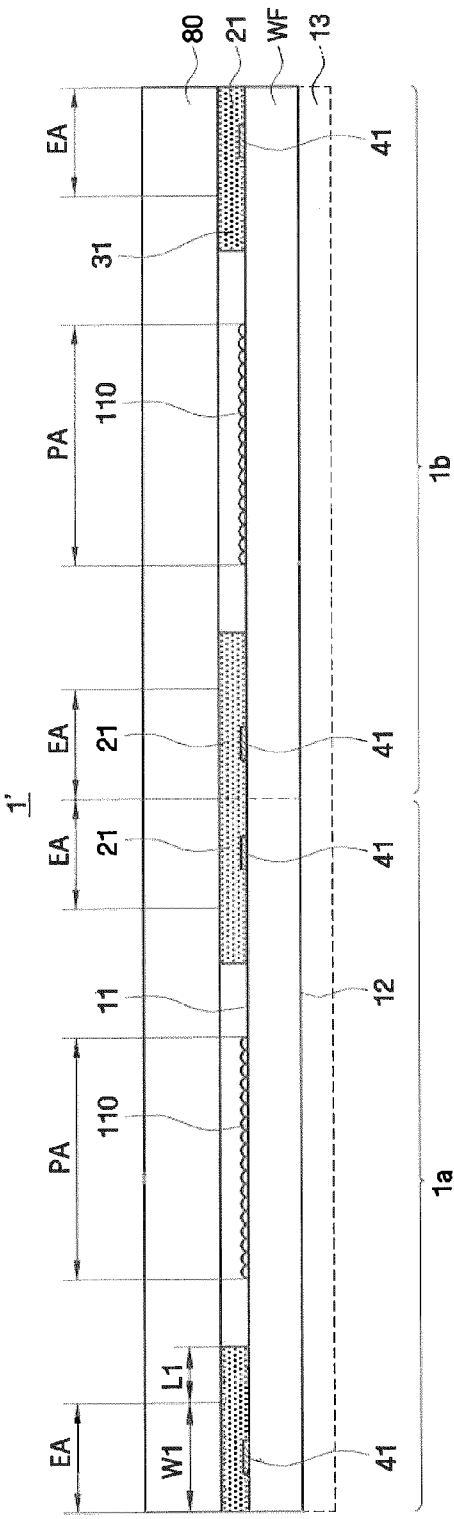

Referring to FIG. 14, a transparent substrate 80 is placed on the wafer WF having the first adhesion patterns 21 and the second adhesion patterns 31. Subsequently, the resultant product is compressed with heat applied, thereby bonding the transparent substrate 80 to the wafer WF. The bonding process may be performed at, for example, 150 to 210° C. Accordingly, a void area VA may be defined between the transparent substrate 80 and the wafer WF. Optionally, the bonding of the transparent substrate 80 may be followed by thinning of the wafer WF.

Figure 15:
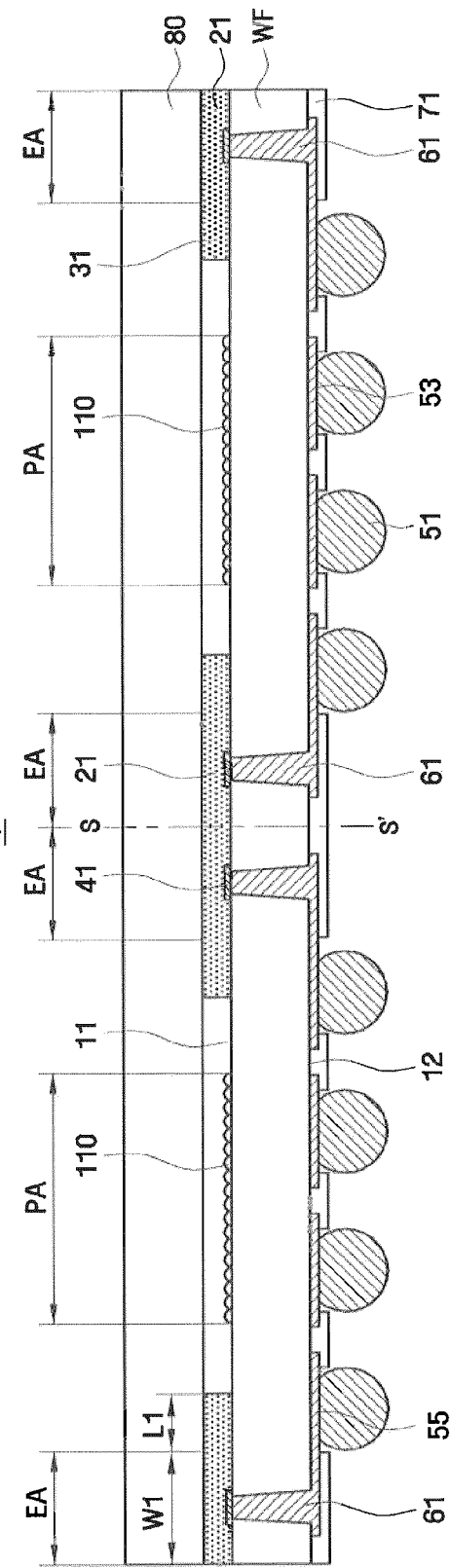

Referring to FIG. 15, the wafer WF in the edge areas EA is partially removed using, for example, laser, thereby forming through via holes to expose bottom surfaces of conductive pads 41.

Next, a conductive layer is stacked and patterned, thereby forming through vias 61 electrically contacting the conductive pads 41 while covering side walls of the through via holes. Redistribution pads 53 are formed, which are electrically connected to the through vias 61 and disposed on a second surface 12 of the semiconductor chip regions 10a and 10b. Next, an insulation layer 71 partially covering the through vias 61 and the redistribution pads 53 is formed. Then, external connection terminals 51 are formed on the redistribution pads 53, which are not covered by the insulation layer 71 but are exposed. The external connection terminals 51 may be shaped of, for example, solder balls. The external connection terminals 51 may include junction regions 55 contacting the redistribution pads 53. Each of the junction regions 55 may face the second surface 12 of the semiconductor chip 10. The external connection terminals 51 may be formed to overlap the second adhesion patterns 31. The external connection terminals 51 may be formed such that the second adhesion patterns 31 overlap the center of the junction regions 55. Alternatively, the external connection terminals 51 may be formed to overlap the second adhesion patterns 31 past the center of the junction region 55.

Figure 16:
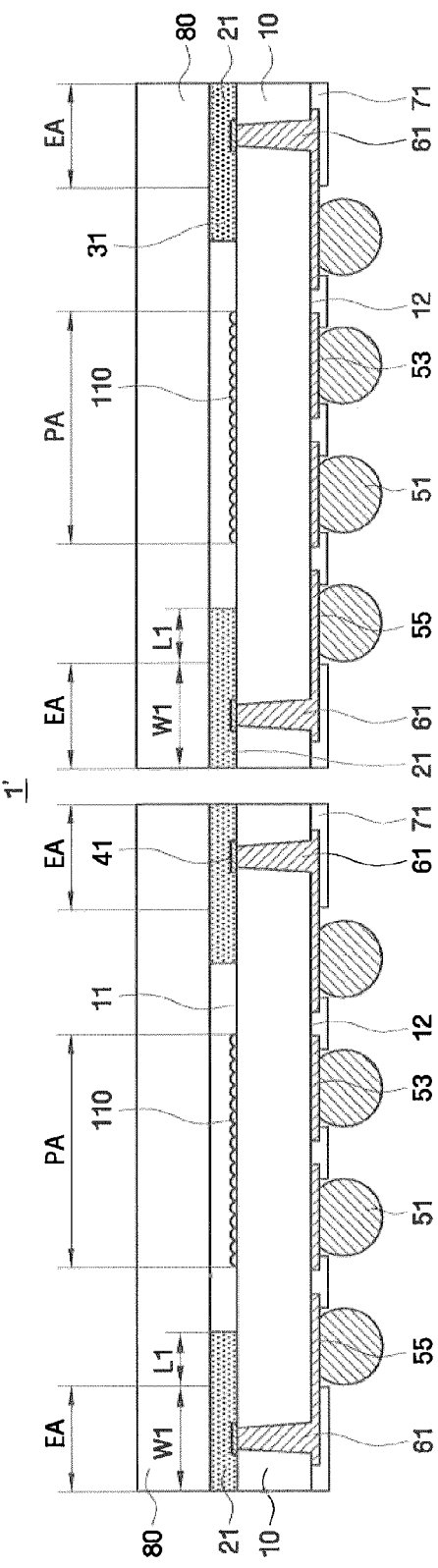

Referring to FIG. 16, a singulation process is performed by cutting the transparent substrate 80 and the wafer WF on the basis of line S-S' to yield discrete unit semiconductor chips 10. The singulation process may be performed using, for instance, a diamond blade. Consequently, the semiconductor package 1' having substantially the same configuration as the semiconductor package 1 described in FIGS. 1 and 2 can be completed.

Although the present embodiment illustrates that the first adhesion patterns 21 and the second adhesion patterns 31 are formed on a surface of the wafer WF, the first adhesion patterns 21 and the second adhesion patterns 31 may be formed on a surface of the transparent substrate 80. Thereafter, the wafer WF may be bonded to the transparent substrate 80, followed by turning over the resultant product.

Next, a method for manufacturing a semiconductor package according to another embodiment of the present general inventive concept will be described with reference to FIGS. 17 through 20.

FIGS. 17 through 20 are cross-sectional views illustrating a method for manufacturing a semiconductor package 2' according to another embodiment of the present general inventive concept. For brevity of explanation, elements which have the same functions as those of the first embodiment are denoted by the same reference numerals and symbols, and thus the repetition of the description thereof is omitted.

Second adhesion patterns 210 are formed to be spaced apart from first adhesion patterns 21 and to have shapes of islands, or in other words to be entirely physically separated from the first adhesion patterns 21. Meanwhile, external connection terminals 51 may include junction regions 55 facing a second surface 12 of a wafer WF, and the second adhesion patterns 210 are formed to overlap the junction regions 55 of the external connection terminals 51. The second adhesion pattern 210 overlaps the junction region 55 by at least one fourth (¼) of the area of the junction region 55. In addition, the second adhesion pattern 210 may overlap the external connection terminal 51 at and through the center of the junction region 55. As other details of the present embodiment are substantially the same as those of the embodiments described above, repetition of the detailed description thereof is omitted.

Figure 17:
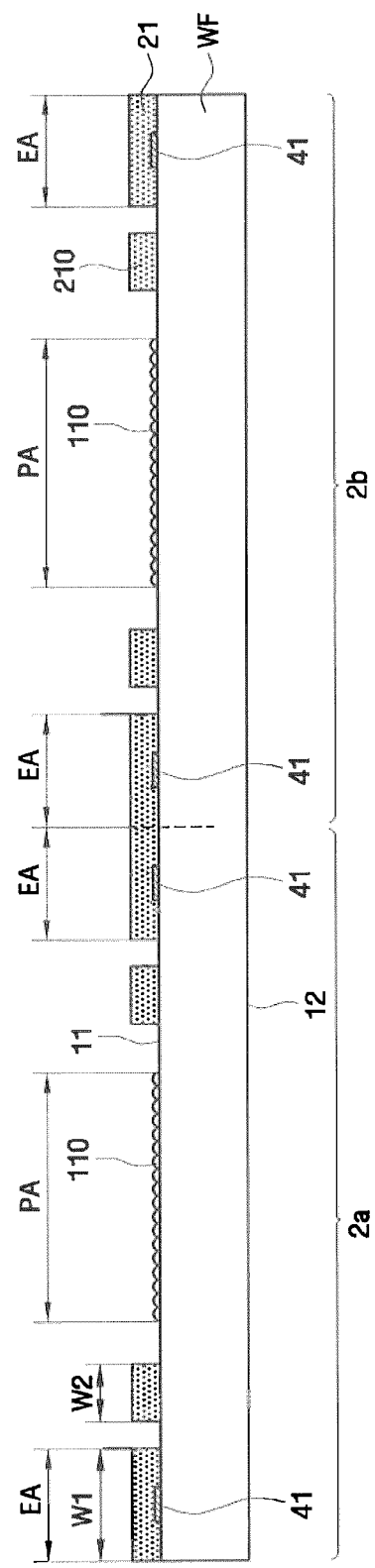
FIGS. 17 through 20 are cross-sectional views illustrating a method for manufacturing a semiconductor package according to a fourth embodiment of the present general inventive concept.
Figure 18:
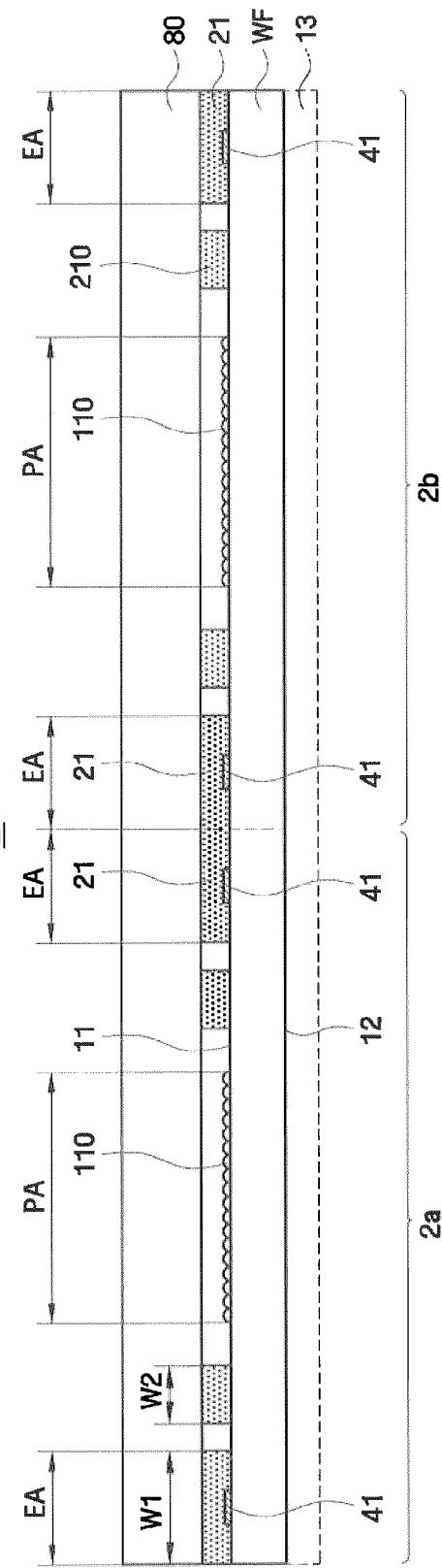
Figure 19:
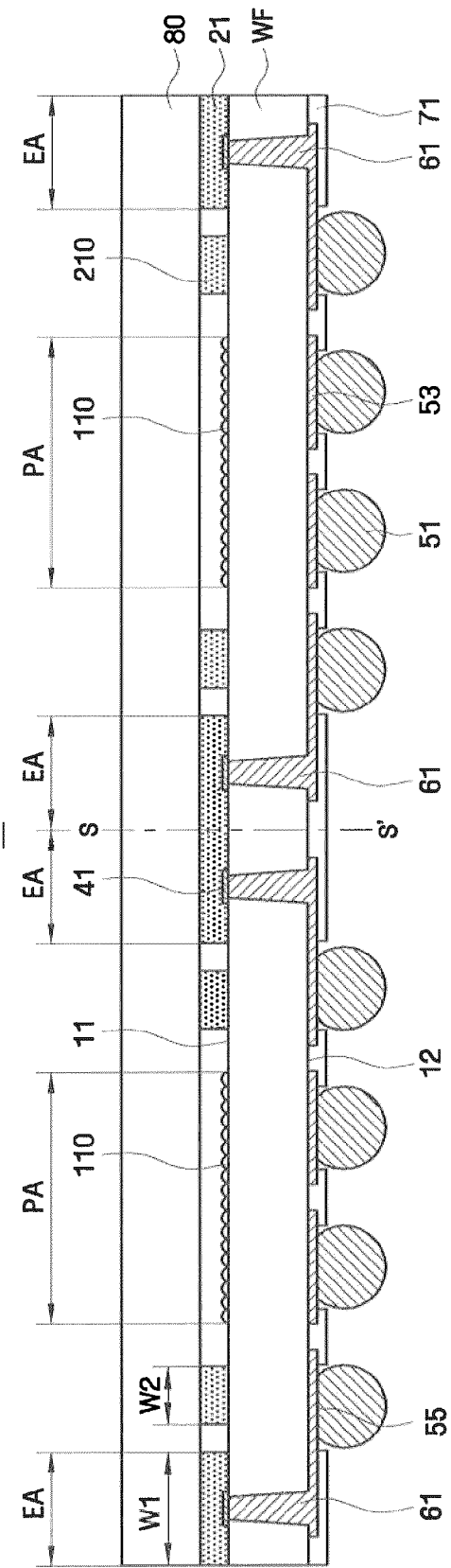
Figure 20:
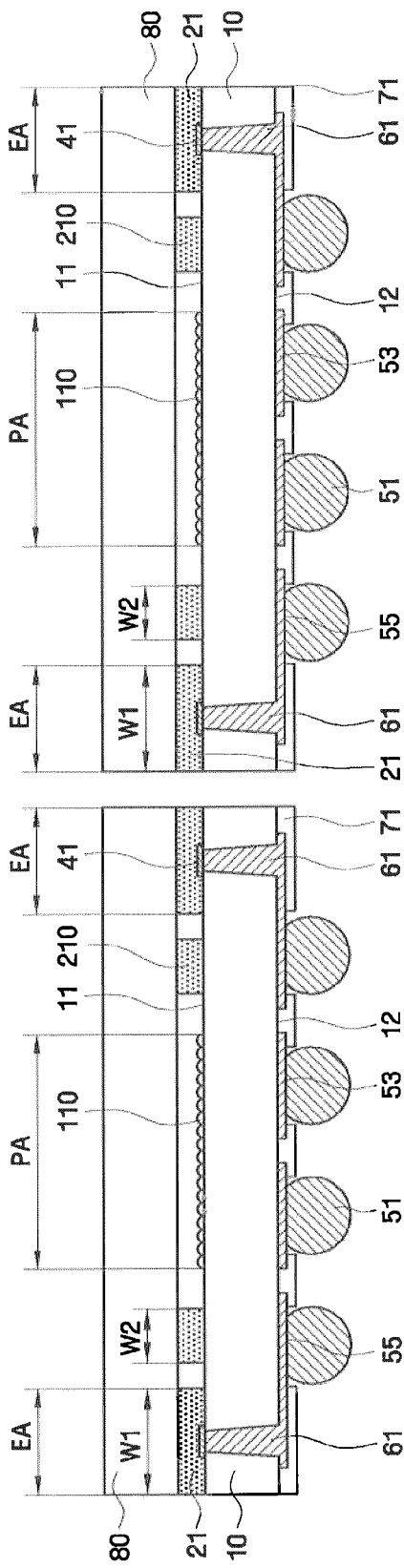

In FIG. 17, a wafer WF is provided and the first adhesion patterns 21 and second adhesion patterns 210 are formed on the first surface 11 of the wafer WF. The wafer may have edge areas EA and pixel areas PA corresponding to different semiconductor package regions 2a and 2b. Microlenses 110 may also be formed on the first surface 11 of the wafer WF. In FIG. 18, a transparent substrate 80 is pressed onto the first and second adhesion patterns 21 and 210. In FIG. 19, vias 61 are formed in the wafer WF and redistribution pads, external connection terminals 51, and insulation layers 71 may also be formed on the second surface 12 of the wafer WF. In FIG. 20, the wafer WF and transparent substrate 80 are cut in the edge areas EA to form separate semiconductor packages 2'.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims. It is therefore desired that the present embodiments be considered in all respects as illustrative and not restrictive, reference being made to the appended claims rather than the foregoing description to indicate the scope of the general inventive concept.

Although a few embodiments of the present general inventive concept have been shown and described, it would be appreciated by those skilled in the art that changes may be made in these embodiments without departing from the principles and spirit of the general inventive concept, the scope of which is defined in the claims and their equivalents.

What is claimed is:

1. A method of manufacturing a semiconductor package, the method comprising:
   preparing a semiconductor chip having a first surface, a second surface and a pixel area;
   forming first adhesion patterns on the first surface;
   forming second adhesion patterns on the first surface to be disposed between the first adhesion patterns and the pixel area; and
   forming external connection terminals on the second surface,
   wherein the second adhesion patterns and the external connection terminal overlap each other in a direction perpendicular to the first surface.

2. The method of claim 1, wherein the forming of the first and second adhesion patterns comprises forming an adhesive polymer layer on the first surface, and patterning the adhesive polymer layer.

3. The method of claim 2, wherein the first adhesion patterns are formed to surround the pixel area.

4. The method of claim 3, wherein the second adhesion patterns are formed to protrude from the first adhesion patterns and face the pixel area.

5. The method of claim 4, wherein the external connection terminal includes a junction region facing the second surface, and the second adhesion patterns overlap the center of the junction region.

6. The method of claim 4, wherein a ratio of a width of the first adhesion pattern to a protruding length of the second adhesion pattern is in a range of 0.5 to 2.

7. The method of claim 3, wherein the second adhesion patterns are formed to be spaced apart from the first adhesion patterns and to have patterns shaped of islands.

8. The method of claim 7, wherein the external connection terminal includes a junction region facing the second surface, and the second adhesion pattern overlaps the junction region by at least one fourth (¼) of the area of the junction region.

9. The method of claim 8, wherein the second adhesion patterns overlap the center of the junction region.

10. The method of claim 1, wherein the first adhesion patterns and the second adhesion patterns are formed using a screen printing process, an ink jet printing process, or a dispenser process.

11. A method of forming a semiconductor package, comprising:
    forming a first adhesion pattern peripherally on a first surface of a semiconductor wafer to surround a pixel area;
    forming a second adhesion pattern between the first adhesion pattern and the pixel area, with the second adhesion pattern to protrude from, and be connected to, the first adhesion pattern to face the pixel area;
    attaching a transparent substrate to the first and second adhesion patterns;
    forming external connection terminals on a second surface of the semiconductor wafer opposite the first surface,
    wherein the second adhesion pattern includes at least a first protruding part connected to the first adhesion pattern to face the pixel area and, optionally, the at least first protruding part further includes a second protruding part attached thereto, having a preselected contour and being unattached to other first protruding parts, wherein the second adhesion pattern includes a plurality of protrusions that extend from the first adhesion pattern toward the pixel area, wherein the plurality of protrusions overlaps the respective external connection terminals in a direction perpendicular to the first surface of the semiconductor wafer.

12. The method of claim 11, further comprising:

forming vias in the semiconductor wafer to connect conductive pads located on the first surface with redistribution pads located on a second surface opposite the first surface;

forming insulation layers on the second surface to cover portions of the redistribution pads; and cutting the semiconductor wafer to form separate semiconductor chips.

\* \* \* \* \*